(12) United States Patent
Yu et al.

(10) Patent No.: US 7,532,763 B2
(45) Date of Patent: May 12, 2009

(54) METHOD AND A DEVICE FOR PROCESSING BIT SYMBOLS GENERATED BY A DATA SOURCE; A COMPUTER READABLE MEDIUM; A COMPUTER PROGRAM ELEMENT

(75) Inventors: Rongshan Yu, Centros (SG); Susanto Rahardja, Centros (SG); Xiao Lin, Centros (SG)

(73) Assignee: Agency for Science, Technology and Research, Singapore (SG)

( * ) Notice: Subject to any disclaimer, the term of this patent is extended or adjusted under 35 U.S.C. 154(b) by 506 days.

(21) Appl. No.: 10/532,773

(22) PCT Filed: Oct. 24, 2002

(86) PCT No.: PCT/SG02/00248

§ 371 (c)(1),
(2), (4) Date: Oct. 7, 2005

(87) PCT Pub. No.: WO2004/042933

PCT Pub. Date: May 21, 2004

(65) Prior Publication Data

US 2006/0200709 A1 Sep. 7, 2006

(51) Int. Cl.
*G06K 9/36* (2006.01)
*G06K 9/46* (2006.01)

(52) U.S. Cl. .................... 382/238; 382/233; 382/244; 382/247

(58) Field of Classification Search ................ 382/233, 382/238, 239, 240, 244, 247; 341/51, 107
See application file for complete search history.

(56) References Cited

U.S. PATENT DOCUMENTS

| 5,881,176 | A | * | 3/1999 | Keith et al. | .................. 382/248 |
| 5,903,676 | A | * | 5/1999 | Wu et al. | ..................... 382/244 |
| 6,433,707 | B1 | | 8/2002 | Crandall | ....................... 341/50 |
| 6,477,280 | B1 | * | 11/2002 | Malvar | ........................ 382/245 |

FOREIGN PATENT DOCUMENTS

EP   1030524   8/2000

(Continued)

OTHER PUBLICATIONS

J. Li and S. Lie, "An Embedded Still Image Coder with Rate-Distortion Optimization", IEEE Trans. On Image Processing, vol. 8, pp. 913-924, Jul. 1999.

(Continued)

*Primary Examiner*—Phuoc Tran
(74) *Attorney, Agent, or Firm*—K. David Crockett, Esq.; Crockett & Crockett

(57) ABSTRACT

A method for processing bit symbols generated by a data source, in particular a video, still image or audio source, comprising the following steps of constructing a plurality of bit-planes from the data source, each bit-plane comprising a plurality of bit-plane symbols; scanning the bit-plane symbols of each bit-plane to generate a binary string of bit-plane symbols; and encoding the binary string of the bit-plane symbols using a statistical model, wherein the statistical model is based on statistical properties of a Laplacian probability distribution function which characterizes the data source.

28 Claims, 3 Drawing Sheets

FOREIGN PATENT DOCUMENTS

| | | | |
|---|---|---|---|
| JP | 08-167854 A | 6/1996 | |
| JP | 10-336463 A | 12/1998 | |
| JP | 2002501687 A | 1/2002 | |
| WO | WO98/34398 A3 | 8/1998 | |
| WO | WO 01/17268 A1 | 3/2001 | |

OTHER PUBLICATIONS

G.G. Langdon and J. Rissanen, "A Simple General Binary Source Code", IEEE Trans. Information Theory, vol. 28, pp. 800-803, 1982.

D. Taubman and A. Zakhor, "Multirate 3-D Subband Coding of Video", IEEE Trans. Image Processing, vol. 3, pp. 572-588, Sep. 1994.

E. Ordentlich et al, "A Low-Complexity Modeling Approach for Embedded Coding of Wavelet Coefficients", HP Labs Tech. Reports, HPL-97-150, 1997.

M.J. Weinberger et al, "The LOCO-I lossless Image Compression Algorithm:Principles and Standardization into JPEG-LS", IEEE Trans. Image Processing, vol. 9, pp. 1309-1324, Aug. 2000.

* cited by examiner

METHOD AND A DEVICE FOR PROCESSING BIT SYMBOLS GENERATED BY A DATA SOURCE; A COMPUTER READABLE MEDIUM; A COMPUTER PROGRAM ELEMENT

BACKGROUND OF THE INVENTION

Embedded coding has generated tremendous interest in video, image and audio processing. This is because embedded coding allows the encoder to terminate the encoding process at any point to meet a pre-determined target bit rate. Furthermore, the decoder can truncate the bit-stream at any point and is still able to obtain a reasonable good quality of the decoded video, image or audio. In other words, an ideal embedded coding system is able to provide rate-distortion optimized truncated bit-streams, making it an ideal coding tool for building systems with Fine Granularity Scalability (FGS).

A popular method to implement an embedded coding system is by sequential bit-plane coding (BPC) due to its simplicity. In BPC, input data vectors from a data source are represented in bit-planes, and the bit-planes are then encoded sequentially, starting from the most significant bit-plane which represents the most significant bits (MSB) of the input data vectors, to the least significant bit-plane which represents the least significant bits (LSB) of the input data vectors. In addition to its structural simplicity, such encoding sequence from the MSB to the LSB of the input data vectors satisfies a principle of the embedded coding process as disclosed in [1], wherein bits affecting the quality of the video/image/audio data most should be encoded first.

Generally, implementing a bit-plane coding that gives an optimized value of the rate-distortion curve is extremely complex and requires high computational resources. This is because for general data sources, there exists statistical dependencies among bit-planes as well as among data samples. In order to capture such dependencies, an entropy coder has to employ a frequency table with a large number of entries, which does not only increase the complexity of the entropy coder but may also result in large modeling cost [2] that eventually degrades the coding performance. Therefore, most practical implementations of bit-plane coding usually adopt a compromised approach to reduce the computational complexities, which unfortunately, result in performance degradation.

Hence, it is desirable to have a bit-plane coding process which gives an optimized value of the rate-distortion curve, which is of a low computational complexity, and yet does not result in substantial degradation in performance.

SUMMARY OF THE INVENTION

It is an object of the invention to provide an embedded coding scheme which is of low computational complexity, but have performance which is comparable to any of the systems mentioned above.

The object is achieved by the features of the independent claims. Additional features result from the dependent claims.

The present invention relates to a method for processing bit symbols generated by a data source, in particular a video, still image or audio source, comprising the steps of constructing a plurality of bit-planes using the bit symbols generated by the data source, each bit-plane comprising a plurality of bit-plane symbols, scanning the bit-plane symbols of each bit-plane to generate a binary string of bit-plane symbols, and encoding the binary string of the bit-plane symbols using a statistical model, wherein the statistical model is based on statistical properties of a Laplacian probability distribution function which characterizes the data source.

The bit symbols generated by the data source, which comprises a plurality of input data vectors, are first arranged in such a manner so that a plurality of bit-planes are formed. Each bit-plane comprises a plurality of bit-plane symbols which corresponds to each bit symbol of the data source.

The data source may refer to any kind of data signal which can be captured by a capturing device for further processing. Specifically, the data source in this specification refers to a video, a still image or an audio source which can be captured by a video recorder, camera and microphone, respectively, for further processing.

Starting from a bit-plane, preferably the bit-plane containing the MSB of the input data vectors, all the bit-plane symbols are scanned to select bit-plane symbols according to a certain manner in order to generate a binary string of bit-plane symbols. The binary string of bit-plane symbols generated by the scanning process then are encoded using a statistical model. The statistical model is generated based on statistical properties of a Laplacian probability distribution function (pdf) of the data source, in particular a video/image/audio source.

The advantage of using a statistical model which is based on the statistical properties of a Laplacian pdf for encoding the binary string of bit-plane symbols is that the computational complexity of the encoding process based on this kind of statistical model is very low. When the statistical model is based on the statistical properties of a general pdf, an extremely large probability table is required to be maintained in the encoder, which is unsuitable for applications with limited computational resources and storage capacity. In order to overcome this problem, most BPC schemes according to the state of the art only entropy encode a limited subset of bit-plane symbols that have very skew distribution, resulting in substantial loss of coding efficiency.

By exploiting statistical properties of a Laplacian pdf of the data source according to the invention, the need for such a large probability table is eliminated, resulting in a substantial reduction in computational complexity and yet without any substantial loss of quality.

The encoding method according to the invention uses an entropy encoding process, which is a form of data compression method based on statistical models. Preferably, an arithmetic encoder is used as an entropy encoder for encoding the binary string of bit-plane symbols generated by the scanning process.

Arithmetic encoding, an entropy encoding process, is preferred since it provides good compression ratio.

A Laplacian pdf can be defined using the following function:

$$f(x) = \frac{e^{-|x|\sqrt{\frac{2}{\sigma^2}}}}{\sqrt{2\sigma^2}}$$

wherein $\sigma$ is the standard deviation, or the distribution parameter, of the Laplacian pdf.

According to an embodiment of the invention, the above equation of the Laplacian pdf is used to determine the probability assignment to each of the bit-plane symbols. The determined probability assignment is subsequently used to determine the statistical model for encoding the binary string of bit-plane symbols.

Specifically, the probability assignment to each of the bit-plane symbol is determined using the following equation:

$$P_j = 1 - \left(1 + e^{-2^j \sqrt{\frac{2}{\sigma^2}}}\right)^{-1}, \quad j = M-1, M-2, \ldots$$

wherein $P_j$ is the probability assignment to the bit-plane symbol, and j represents the bit-plane.

The above probability assignment equation is obtained from the Laplacian pdf, and is used to determine the probability of each bit-plane symbol. Such probability or statistical information of the data source is subsequently used by the encoder, in particular the arithmetic encoder, for encoding the binary string of bit-plane symbols.

Due to the statistical properties of the Laplacian pdf, the complexity of determining the probability distribution of each bit-plane is tremendously reduced.

In another embodiment where the standard deviation, $\sigma$, is not known, the probability assignment to each bit-plane symbol is determined based on the knowledge from encoding the previous bit-plane symbols.

Such an adaptive process is useful in practical applications when knowledge of the statistical properties of the data source is not known, or when the data source is non-stationary. In such cases, the statistical properties of the data source are determined based on information obtained from previously encoded bit-plane symbols.

Specifically, the probability assignment to each bit-plane symbol in this embodiment is given by the following equation:

$$P_j = \frac{N_a}{N} P_j^{N_a} + \left(1 - \frac{N_a}{N}\right) P_j^{ML}$$

wherein $P_j$ is the probability assignment to the bit-plane symbol, $N_a$ is the number of bit-plane symbols coded until the end of the previous bit-plane, N is the number of bit-plane symbols coded in the current bit-plane symbol, $P_j^{N_a}$ is the estimation of $P_j$ after observing $N_a$ bit-plane symbols, $P_j^{ML}$ is the maximum likelihood estimation of $P_j$ for the current bit-plane and is defined by $$P_j^{ML} = \frac{\sum_{j=1}^{N-N_a} b_{i,j}}{N - N_a}$$

wherein $b_{i,j}$ is the bit-plane symbol.

Preferably, the estimation of $P_j$ from previous coded bit planes, $P_j^{N_a}$, is estimated by updating from the previous bit-plane using the following equation:

$$P_j^{N_a} = \frac{\sqrt{P_{j+1}^{N_a}}}{\sqrt{1 - P_{j+1}^{N_a}} + \sqrt{P_{j+1}^{N_a}}}$$

wherein $P_{j+1}^{N_a}$ is the estimation of $P_j$ from the previous bit-plane.

In another embodiment of the invention, the method for processing bit symbols generated by a data source further comprises the steps of determining an optimal bit-plane (referred to as lazy plane) from the input data vector to be coded, determining a probability assignment to each bit-plane based on its relation with the lazy plane, wherein the probability assignment to the bit-plane is used as the statistical model for encoding the binary string of bit-plane symbols.

In this embodiment, the computational complexity of the encoding process is further reduced since the probability assignment to each bit-plane is explicitly determined by a relationship with the lazy plane.

Firstly, the lazy plane is selected from the plurality of bit-planes. The lazy plane is represented by an integer, L, which satisfies the following inequality:

$$\phi^{2-L+1} \leq \theta < \phi^{2-L}$$

wherein $\phi$ is defined by $$\left(\frac{\sqrt{5}-1}{2}\right),$$

and $\theta$ is defined as $\theta$ $$\theta \triangleq e^{\sqrt{\frac{2}{\sigma^2}}}.$$

The above decision rule actually partitions the support of the distribution parameter, $\sigma$, into disjointed regions, and the lazy plane corresponding to each partitioned region is specified so that it satisfies the above inequality.

After the lazy plane is determined according to the invention, the probability assignment to each bit-plane is determined. The probability assignment to each bit-plane is based on its relationship with respect to the optimal bit-plane as given by the equation:

$$Q_j^L = \begin{cases} \frac{1}{1+2^{2^{j-L}}}, & j \geq L \\ \frac{1}{2}, & j < L \end{cases}$$

wherein $Q_j^L$ is the probability assignment to the $j^{th}$ bit-plane.

Alternatively, when the length and the absolute sum of the input data vectors of the data source are known, the lazy plane may be determined using the following equation:

$$L = \min\{L \in Z | 2^{L+1} N \geq A\}$$

wherein

N is the length of the input data vector, and

A is the absolute sum of the input data vector.

The determining of the optimal bit-plane may be implemented by a slight modification of the algorithm as disclosed in [3] to extend the range of order L to a negative integer.

In another alternative embodiment, the probability assignment to each bit-plane which is based on its relationship with respect to the lazy plane may be determined using the equation:

$$Q_j^L = \begin{cases} \dfrac{1}{1+2^{2j-L}}, & j \geq L \\ \dfrac{1}{2}, & j < L \end{cases}.$$

In this embodiment, the encoder may be implemented using the skew coder which is disclosed in [4].

As mentioned, the two alternative embodiments described above has the advantage of further reducing the computational complexity of encoding the binary string of bit-plane symbols.

Furthermore, a method is provided for processing the encoded binary string of bit-plane symbols to generate an output data representing the data source, comprising the steps of decoding the encoded binary string of bit-plane symbols to generate a further binary string of bit-plane symbols so that a plurality of bit-planes comprising the bit-plane symbols can be reconstructed. The plurality of bit-planes are reconstructed with the probability assigned by a further statistical model, and hence the output data representing the input data vectors can be reconstructed. The statistical model is based on a Laplacian probability distribution function which characterizes the bit-plane symbols.

The statistical model generated from the decoding process of the binary string of the bit-plane symbols is identical to the statistical model which is used for the encoding process. In other words, the probability assignment, $P_j$ or $Q_j^L$, used for forming the statistical model in the encoding process is re-generated in the decoding process.

The plurality of bit-planes are thus reconstructed using the identical statistical model used in the encoding process, resulting in the reconstructed output data to be exactly identical to the original data source up to the bit-plane where the encoded binary string of bit-plane symbols is terminated by the decoder.

Furthermore, an optimal mean square error (MSE) reconstruction of the source vectors is produced with the probability assigned by that statistical model. Specifically, the probability assignment $P_j$ is used to form the statistical model in the encoding process, and the data source is reconstructed using the following equation:

$$\hat{x}_i = (2s_i - 1)\left(\sum_{j=M-1}^{T} b_{i,j} 2^j + \sum_{j=T-1}^{-\infty} P_j 2^j\right),$$

wherein $\hat{x}_i$ is the re-constructed data source, and $s_i$ is a sign symbol of $\hat{x}_i$.

T is the bit-plane the encoded binary string of bit-plane symbols is terminated

Similarly, when the probability assignment $Q_j^L$ is used to form the statistical model in the encoding process, the data source is reconstructed using the following equation:

$$\hat{x}_i = (2s_i - 1)\left(\sum_{j=M-1}^{T} b_{i,j} 2^j + \sum_{j=T-1}^{-\infty} Q_j^L 2^j\right).$$

As can be seen from above, the second summation $$\sum_{j=M-T-1}^{-\infty} Q_j^L 2^j$$

is used for enhancing the quality of the re-generated data source, which can be stopped once a desired quality is achieved.

The described embodiments of the invention apply not only to the method, but also to a device, a computer readable medium and a computer program.

DETAILED DESCRIPTION OF THE PREFERRED EMBODIMENT OF THE INVENTION

Figure 1:
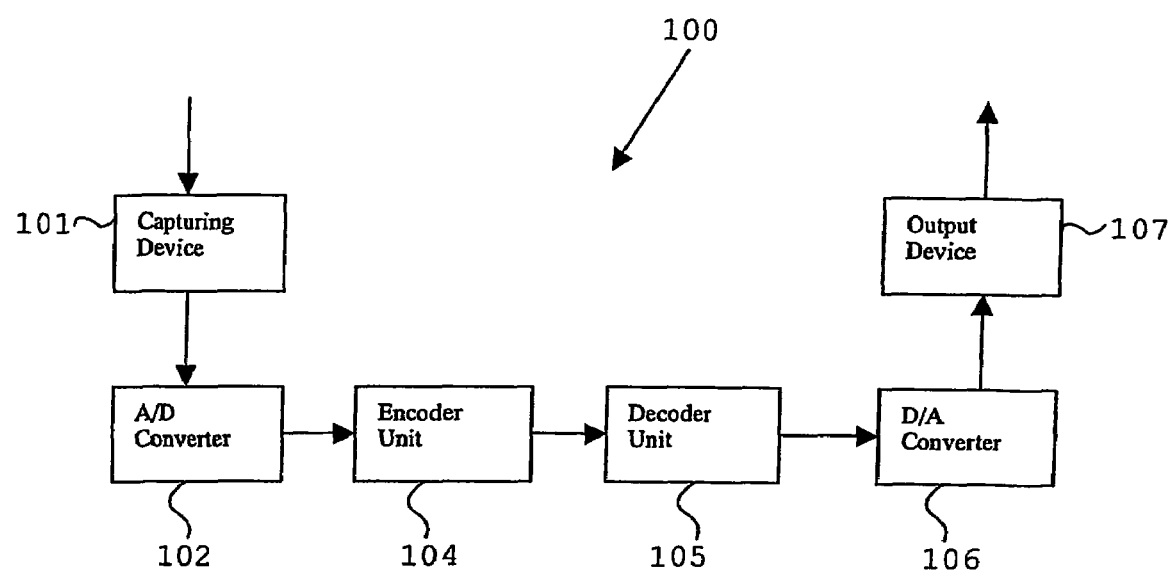
FIG. 1 shows a general structure of a video/image/audio coding system.

FIG. 1 shows a general structure of a video/image/audio coding system 100. A data source, in particular video, still image or audio source, is received by a capturing device 101. The capturing device 101 may be a video recorder, a camera or a microphone for capturing different types of data source. The captured data is first converted into a digital signal by an Analog-to-Digital (A/D) converter 102 for further processing.

The bit symbols of the data source generated in the A/D converter are received by a bit-plane coding system 103 (which will be described in detail later) comprising an encoder unit 104 and a decoder unit 105. The encoder unit 104 encodes the bit symbols and transmits the encoded symbols over a channel to the decoder unit 105.

The decoder unit 105 decodes the encoded symbols and sends the decoded symbols to an output device 107, for example a digital television or digital camera, to be displayed. If the output device 107 is an analog device (for example an audio speaker), a Digital-to-Analog (D/A) converter 106 may be used to convert the decoded symbols to an analog signal before outputting them to the output device 107.

Figure 2:
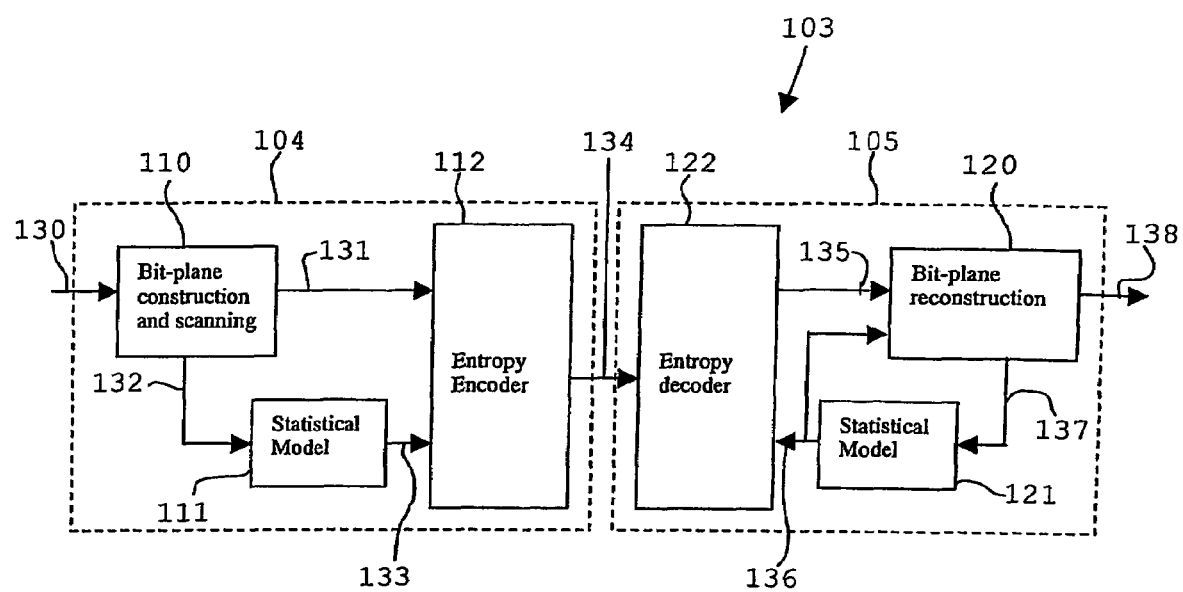
FIG. 2 shows a general structure of a bit-plane coding system.

FIG. 2 shows a general structure of a bit-plane coding system 103, comprising an encoder unit 104 and a decoder unit 105. The encoder unit 104 further comprises a bit-plane construction and scanning unit 110, a first statistical model unit 111 and an entropy encoder 112. The decoder unit 105 further comprises an entropy decoder 122, a second statistical model unit 121 and a bit-plane reconstruction unit 120.

At the start of the encoding process, the bit symbols 130 are received by the bit-plane construction and scanning unit 110.

The bit symbols 130 comprises a plurality of input data vectors which can be represented as $$x=\{x_1, x_2, \ldots, x_k\} \quad (1)$$

for a k-dimensional input data vector, wherein $x_i$ is extracted from an independent and identical distributed (i.i.d.) random source of some alphabet $A \subset \Re$.

$x_i$ may also be represented in binary form as $$x_i = (2s_i - 1) \cdot \sum_{i=M-1}^{-\infty} b_{i,j} \cdot 2^j, \, i = 1, \ldots, k \quad (2)$$

wherein $s_i$ is the sign symbol which is expressed as $$s_i \cong \begin{cases} 1 & x_1 \geq 0 \\ 0 & x_1 < 0 \end{cases}, \quad (3)$$

and $b_{i,j}$ is the amplitude symbol wherein $b_{i,j} \in \{0,1\}$. The binary representation of $x_i$ is also normalized as integer M satisfies the following inequality:

$$2^{M-1} \leq \max\{|x_i|\} < 2^M, i=1, \ldots, k \quad (4)$$

When each input data vector of the bit symbols 130 is received by the bit-plane construction and scanning unit 110, the input data vector is decomposed into its sign symbol $s_i$ and amplitude symbols $b_{i,j}$. The sign and amplitude symbols of the input data vectors are arranged to form a plurality of bit-planes, with each bit-plane containing a sign symbol $s_i$ or an amplitude symbol $b_{i,j}$ from each input data vector. Generally, the amplitude symbols $b_{i,j}$ corresponding to the most significant bit (MSB) of the input data vectors are arranged in a first bit-plane, and the amplitude symbols $b_{i,j}$ of the second MSB are arranged in a second bit-plane, and so on. The sign symbols $s_i$ of the input data vectors are also arranged in another separate bit-plane. All the sign and amplitude symbols of the bit-planes are referred to as bit-plane symbols.

Once the bit-planes are constructed, all the bit-plane symbols contained in the bit-planes are scanned, starting from the bit-plane containing the MSB of the input data vectors. The scanning process is to select the bit-plane symbols to form a binary string of bit-plane symbols 131. One possible scanning process is summarized in the following steps:

1. Start scanning from the bit-plane j=M−1 containing the MSB of input data vectors,
2. Select the amplitude symbols $b_{i,j}$ with the corresponding amplitude symbols of all the previous bit-planes being "0": $b_{i,M-1}=b_{i,M-2}= \ldots =b_{i,j+1}=0$.
3. When the amplitude symbol $b_{i,j}$ is "1", the sign symbol $s_i$ is also selected. Steps 2) and 3) are known as the significance pass.
4. Select the amplitude symbols $b_{i,j}$ which are not selected in the significance pass. This step is known as the refinement pass.
5. Progress to the next bit-plane j−1.

The above steps are iterated until a certain terminating criterion, for example when a pre-defined bit-rate is met or a pre-defined rate-distortion constrain has been reached.

Once the binary string of bit-plane symbols 131 is generated by the above scanning process, it is further encoded or compressed in the entropy encoder 112. Statistical properties 132 of the bit-plane symbols of the data source 130 is used in the statistical model 111 to provide the probability assignment 133 which is used for encoding the binary string of bit-plane symbols 131 in the entropy encoder 112.

The encoded data 134 from the entropy encoder 112 is transmitted over a channel, which is subsequently received and decoded by the entropy decoder 122. The channel may be an Internet network, a Wide Area Network (WAN), or a wireless communication network.

The entropy decoder 122 receives and decodes the encoded data 134 into a binary string of bit-plane symbols 135. Theoretically, the binary string of bit-plane symbols 135 generated by the entropy decoder 122 is identical to the binary string of bit-plane symbols 131.

The statistics of the bit-planes 137 is used by the statistical model 121 to generate the probability assignment 136, which is identical to 133 so that the bit-plane symbols can be correctly decoded. The bit-plane symbols 135 are then used by the bit-plane reconstruction unit 120 to reconstruct the bit-planes to generate an output data 138 representing the bit symbols 130 of the data source.

In case that optimal MSE reconstruction is desired, the probability assignment 136 is also used by 120 to reproduce the output data 138.

It should be noted that in order to obtain an optimal compression of the binary string of bit-plane symbols 131 of a data source having a general probability distribution function, the number of bits required by the entropy coder 112 for encoding the bit-plane symbols is given by $-\log_2 \Pr(s_i, b_{i,m-1}, \ldots)$, wherein the probability $\Pr(s_i, b_{i,M-1}, \ldots)$ can be expressed as:

$$\Pr(s_i, b_{i,M-1}, \ldots, b_{i,M-j}) = \Pr(s_i) \Pr(b_{i,M-1}|s_i) \ldots \Pr(b_{i,M-j}|s_i, b_{i,M-1}, \ldots, b_{i,M-j+1}) \quad (5)$$

wherein $\Pr(b_{i,M-j}|s_i, b_{i,M-1}, \ldots, b_{i,M-j+1})$ denotes the conditional probability of $b_{i,M-j}$ on previously coded bit-planes.

In practice, implementing such an entropy encoder for encoding all the bit-plane symbols of the data source will generally require a frequency/probability table with a large number of entries. For encoding at high bit-rates, the number of entries to be maintained in such a frequency table is extremely large and hence is not practical, especially in systems with limited computational and storage capabilities. In addition, it may introduce substantial modeling cost [2] for an adaptive setting for data sources with unknown distribution. Therefore, a simplified approach is adopted in most practical systems wherein only bit-plane symbols with very skew distribution (those symbols scanned in the significance pass) are encoded by the entropy encoder, as described in [5] and [6].

According to the invention for bit-plane coding, the properties of a Laplacian probability distribution function (pdf) which is inherent in most data sources, especially in video, still image and audio sources, is used for encoding of the data source by the entropy encoder 112.

Specifically, the statistical model 111 uses the statistical properties of the Laplacian pdf of the data source to generate the probability assignment 133 for encoding the binary string of bit-plane symbols 132. The Laplacian pdf of the data source can be expressed using the following equation:

$$f(x) = \frac{e^{-|x|\sqrt{\frac{2}{\sigma^2}}}}{\sqrt{2\sigma^2}} \quad (6)$$

wherein σ is the standard deviation or distribution parameter of the Laplacian pdf.

It can be readily verified from (6) that the bit-plane symbols of the Laplacian source has the following independency properties:

$$P_j = Pr(b_{i,j}=1) = Pr(b_{i,j}=1 | s_i, b_{i,M-1}, \ldots, b_{i,j+1}) \quad (7)$$

$$Pr(b_{i,j}=0) = Pr(b_{i,j}=0 | s_i, b_{i,M-1}, \ldots, b_{i,j+1}) = 1 - P_j \quad (8)$$

$$Pr(s_i=1) = Pr(s_i=0) = 0.5 \quad (9)$$

wherein the probability assignment for the entropy coder for each bit-plane j is given by (7)-(9).

From (6), $P_j$ can be calculated as $$P_j = 1 - \left(1 + e^{-2^j \sqrt{\frac{2}{\sigma^2}}}\right)^{-1}, \quad j = M-1, M-2, \ldots \quad (10)$$

When the distribution parameter σ (or the standard deviation) of the Laplacian pdf is known, $P_j$ can be determined directly using equation (10).

When $P_j$ is determined, the probability of each bit-plane symbols can be determined using equations (7) to (9) and such statistical information of the data source is used by the entropy encoder 112 for encoding the binary string of the bit-plane symbols 131.

It can be seen from above that by using the statistical properties of the Laplacian pdf of the data source, the maintenance of a large frequency table according to the prior art is not needed, and hence the encoding process of the binary string 131 by the entropy encoder 112 is greatly simplified.

In a further embodiment of the invention, the probability assignment $P_j$ to each bit-plane symbol determined in equation (10) is used to regenerate the binary bit-plane symbols 135, which is received by the bit-plane reconstruction unit 120 to generate the output data 138 representing the bit symbols of the data source 130.

Specifically, if optimal MSE reconstruction is needed, upon decoding up to bit-plane T of the encoded data 134 by the entropy decoder 122, the optimal reproduction of the output data 138 according to the invention is given by the following equation:

$$\hat{x}_i = (2s_i - 1)\left(\sum_{j=M-1}^{T} b_{i,j} 2^j + \sum_{j=T-1}^{-\infty} P_j 2^j\right) \quad (11)$$

The first summation $$\sum_{j=M-1}^{T} b_{i,j} 2^j$$

is the reconstruction of the bit-plane symbols, and the second summation $$\sum_{j=T-1}^{-\infty} P_j 2^j$$

is the interpolation of the corresponding bit-plane symbols on the Laplacian pdf.

The second summation may be terminated when a predefined criteria is satisfied, for example when a desired quality of the data source is obtained.

In an alternative embodiment of the invention, the probability assignment $P_j$ to the bit-plane symbols is determined adaptively based on the knowledge from encoding previous bit-plane symbols. This adaptive bit-plane coding (ABPC) process is useful when the distribution parameter σ of the Laplacian pdf is not known as in the case of most practical situations.

Starting from Lidston's Law of success when given a string of k distinct symbols, if the $i^{th}$ symbol occurred $n_i$ times in the past n instances, the probability estimation of $i^{th}$ symbol occurring is estimated using the following equation:

$$Pr(i | \{n_i\}, n) = (n_i + \lambda)/(n + k\lambda) \quad (12)$$

Wherein λ is a positive parameter. It can be seen that equation (12) is an interpolation of the maximum likelihood estimate $n_i/n$ and the uniform prior $1/k$ by rewriting equation (12) as:

$$Pr(i | \{n_i\}, n) = \mu(n_i/n) + (1-\mu)(1/k) \quad (13)$$

with the substitution $$\mu = n/(n + k\lambda). \quad (14)$$

Applying equation (13) to the present embodiment of the invention gives $$P_j = \frac{N_a}{N} P_j^{N_a} + \left(1 - \frac{N_a}{N}\right) P_j^{ML} \quad (15)$$

wherein
$N_a$ is the number of bit-plane symbols coded until the end of the previous bit-plane,
N is the number of bit-plane symbols coded in the current bit-plane symbol,
$P_j^{N_a}$ is the estimation of $P_j$ after observing $N_a$ bit-plane symbols,
$P_j^{ML}$ is the maximum likelihood estimation of $P_j$ for the current bit-plane, and
μ gives the interpolation between these two probability estimation. Preferably, μ is given by $$\mu = 1 - (N_a/N) \quad (16)$$

Since the maximum likelihood estimation of $P_j$ for N symbols $b_{i,j}$ at $j^{th}$ bit-plane is given by:

$$P_j^N = \frac{\sum_{j=1}^{N} b_{i,j}}{N} \quad (17)$$

therefore, and $P_j^{ML}$ can be defined by $$P_j^{ML} = \frac{\sum_{j=1}^{N-N_a} b_{i,j}}{N - N_a} \qquad (18)$$

Preferably, from equation (10), $P_j^{N_a}$ can be updated from the previous bit-plane $P_{j+1}^{N_a}$ using the following equation:s $$P_j^{N_a} = \frac{\sqrt{P_{j+1}^{N_a}}}{\sqrt{1 - P_{j+1}^{N_a}} + \sqrt{P_{j+1}^{N_a}}} \qquad (19)$$

The embodiments described so far relate to finding the probability assignment to every bit-plane symbol of the data source.

In another embodiment of the invention, a "two-pass" approach is adopted where the probability assignment to every bit-plane to be used by the entropy encoder for encoding the binary string of bit-plane symbols is determined from the statistics of the data vector to be coded.

In this embodiment, an optimal bit-plane is selected from the plurality of discrete bit-planes, which is referred to as the lazy plane. Information on the selected lazy plane is transmitted by the encoder unit 104 to the decoder unit 105, so that the encoded data 134 can be decoded correctly.

Figure 3:
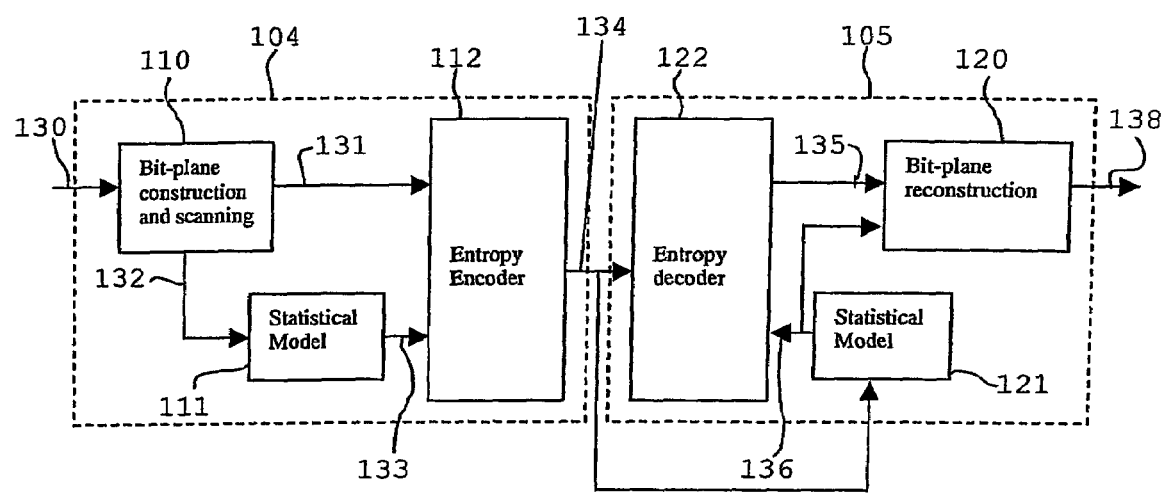
FIG. 3 shows a modified structure of the bit-plane coding according to an embodiment of the invention.

FIG. 3 shows a modified general structure of the bit-plane coding system according to this embodiment of the invention.

The information on the selected lazy plane which is contained in the encoded data 134 is received by the statistical model unit 121. The statistical model unit 121 generates the probability assignment 136 to be received by the entropy decoder 122, so that the bit-plane symbols of the encoded data 134 can be correctly decoded. The decoded bit-plane symbols 135 are then received by the bit-plane reconstruction unit 120 to reconstruct the bit-planes to generate the output data 138 representing the bit symbols 130 of the data source.

Consider a code family given by the following equation:

$$C = \{G^L | L \in Z\} \qquad (21)$$

wherein
$G^L$ denotes the bit-plane symbols of the data source, and
L is an integer which denotes the lazy plane.

The probability assignment according to this embodiment of the invention is given by:

$$Q_j^L = \begin{cases} \frac{1}{1 + 2^{j-L}}, & j \geq L \\ \frac{1}{2}, & j < L \end{cases} \qquad (22)$$

wherein $Q_j^L$ is the probability assignment to the $j^{th}$ bit-plane which follows the probability updating rule as defined by equation (19) for bit-planes $i \geq L$ and enters a "Lazy mode" (since the encoding for probability assignment of ½ can be achieved by outputting the input symbols directly to the encoded binary string) for bit-planes i<L. Such a code family C may be called Bit-Plane Golomb Code (BPGC).

The lazy plane L can be obtained by finding an integer value for L which best satisfies the following inequality:

$$\phi^{2^{-L+1}} \leq \theta < \phi^{2^{-L}} \qquad (23)$$

wherein
L is the integer representing the optimal bit-plane,
$\phi$ is defined by $$\left(\frac{\sqrt{5}-1}{2}\right),$$

and
$\theta$ is defined as $$\theta \triangleq e^{-\sqrt{\frac{2}{\sigma^2}}}. \qquad (24)$$

When sufficient statistics such as the length and the absolute sum of the input data vectors are known, the decision rule of (23) may be further simplified to $$L = \min\{L \in Z | 2^{L+1} N \geq A\} \qquad (25)$$

wherein
N is the length of the input data vector, and
A is the absolute sum of the input data vector.

The selection process as described in this embodiment may be implemented using the algorithm described by [3]. When the algorithm in [3] is used to determine the value of L, only positive integer range of L can be determined. To extend the range of order L to negative integer, the algorithm described by [3] is modified.

Specifically, the modified algorithm of [3] is given as
if (N<=A)
    for (L=1; (N<<(L+1))<A; L++)
else
    for (L=-1; (N>>(-L))>=A; L--)

When the lazy plane L is determined, the probability assignment to the bit-plane to be used for encoding of the binary string of bit-plane symbols by the entropy encoder can be determined.

In another alternative embodiment of the invention, the probability assignment to each bit-plane based on its relationship with respect to the optimal bit-plane is determined using the following equation:

$$Q_j^L = \begin{cases} \frac{1}{2^{2^{j-L}}}, & j \geq L \\ \frac{1}{2}, & j < L \end{cases} \qquad (26)$$

wherein
L is the integer representing the optimal bit-plane as can be determined by (23)

In this embodiment, the probability assignment given by (26) hence enable the use of the skew coder as described in [4] as an extremely low complexity implementation of the entropy coder instead of a general arithmetic coder. The skew coder of [4] is able to simplify the entropy encoding process to only a small number of bit-shift and addition operations by restricting the probability interval width corresponding to the least probable symbol (LPS) to the powers of 2. In addition, the skew coder of [4] retains a unique simplicity in implementing the acceleration technique [6] in coding a run of successive most probable symbols (MPS) that is typical in coding bit-planes with high probability skew.

It should be noted that in all the described embodiments of the invention, except the embodiment for generating the BPSC, arithmetic encoder should preferably be used as the entropy encoder.

In a further embodiment of both the embodiments of the invention mentioned above, the probability assignment $Q_j^L$ to each bit-plane symbol determined in equations (22) or (26) is used to generate the output data 138 by the bit-plane reconstruction unit 120, representing the bit symbols 130 of the data source.

Specifically, upon decoding up to a bit-plane T of the transmitted data 134 by the entropy decoder 122, the optimal reproduction of the output data 138 according to the invention is given by the following equation:

$$\hat{x}_i = (2s_i - 1)\left(\sum_{j=M-1}^{T} b_{i,j} 2^j + \sum_{j=T-1}^{-\infty} Q_j^L 2^j\right) \quad (27)$$

Similarly to equation (11), the first summation $$\sum_{j=M-1}^{T} b_{i,j} 2^j$$

is the reconstruction of the bit-plane symbols, and the second summation $$\sum_{j=T-1}^{-\infty} Q_j^L 2^j$$

is the interpolation of the corresponding bit-plane symbol of the output data 138 on the Laplacian pdf.

The second summation may be terminated when a predefined criteria is satisfied, for example when a desired quality of the data source is obtained.

The described embodiments of the invention apply not only to a method but also to a device, a computer readable medium and a computer program.

While the embodiments of the invention have been described, they are merely illustrative of the principles of the invention. Other embodiments and configurations may be devised without departing from the spirit of the invention and the scope of the appended claims.

The following documents are cited in this specification:

[1] J. Li and S. Lie, "An embedded still image coder with rate-distortion optimization", IEEE Trans. on Image Processing, vol. 9, pp. 1158-1170, July 2000.

[2] J. Rissanen, *Stochastic Complexity in Statistical Inquiry*, London, U.K.: World Scientific, 1989.

[3] M. J. Weinberger et al, "The LOCO-I lossless image compression algorithm: principles and standardization into JPEG-LS", IEEE Trans. Image Processing, vol. 9, pp 1309-1324, August 2000.

[4] G. G. Langdon and J. Rissanen, "A simple general binary source code", IEEE Trans. Information Theory, vol. 28, pp. 800-803, 1982.

[5] D. Taubman and A. Zakhor, "Multirate 3-D subband coding of video", IEEE Trans. Image Processing, vol. 3, pp. 572-588, September 1994.

[6] E. Ordentlich et al, "A low-complexity modeling approach for embedded coding of wavelet coefficients", HP Labs Tech. Reports, HPL-97-150, 1997.

What is claimed is:

1. A method for processing bit symbols generated by a data source, in particular a video, still image or audio source, comprising:
   constructing a plurality of bit-planes using the bit symbols generated by the data source, each bit-plane comprising a plurality of bit-plane symbols;
   scanning the bit-plane symbols of each bit-plane to generate a binary string of bit-plane symbols;
   encoding the binary string of the bit-plane symbols using a statistical model, wherein the statistical model is based on statistical properties of a Laplacian probability distribution function which characterizes the data source, wherein the Laplacian probability distribution function is defined by $$f(x) = \frac{e^{-|x|\sqrt{\frac{2}{\sigma^2}}}}{\sqrt{2\sigma^2}}$$

wherein σ is the standard deviation of the Laplacian probability distribution function.

2. The method according to claim 1, wherein the encoding of the binary string of bit-plane symbols is performed by an entropy encoder.

3. The method according to claim 2, wherein an arithmetic encoder is used as the entropy encoder.

4. The method according to claim 1, wherein a probability assignment to each bit-plane symbol is determined based on the Laplacian probability distribution function and is used to determine the statistical model for encoding the binary string of bit-plane symbols.

5. The method according to claim 4, wherein the probability assignment to the bit-plane symbol is determined by $$P_j = 1 - \left(1 + e^{-2^j\sqrt{\frac{2}{\sigma^2}}}\right)^{-1}, \, j = M-1, M-2, \ldots$$

wherein
$P_j$ is the probability assignment to the bit-plane symbol, and
j is the bit-plane.

6. The method according to claim 4, wherein the probability assignment to the bit-plane is determined by $$Q_j^L = \begin{cases} \frac{1}{1+2^{2^{j-L}}}, & j \geq L \\ \frac{1}{2}, & j < L \end{cases}$$

wherein $Q_j^L$ is the probability assignment of the $j^{th}$ bit-plane,

L is the integer representing a predetermined optimal bit-plane from the plurality of constructed bit-planes, and j is the bit-plane.

7. The method according to claim 4, wherein the probability assignment to the bit-plane is determined by $$Q_j^L = \begin{cases} \frac{1}{2^{2^{j-L}}}, & j \geq L \\ \frac{1}{2}, & j < L \end{cases}$$

wherein $Q_j^L$ is the probability assignment of the $j^{th}$ bit-plane,

L is the integer representing a predetermined optimal bit-plane from the plurality of constructed bit-planes, and j is the bit-plane.

8. The method according to claim 6 or 7, further comprising:

determining an optimal bit-plane from the plurality of constructed bit-planes;

determining a probability assignment to each bit-plane based on its relation to the optimal bit-plane;

wherein the probability assignment to the bit-plane is used as the statistical model for encoding the binary string of bit-plane symbols.

9. The method according to claim 8, wherein the optimal bit-plane is determined by determining an integer which best satisfies $$\phi^{2-L+1} \leq \theta < \phi^{2-L}$$

wherein $\phi$ is defined by $$\left(\frac{\sqrt{5}-1}{2}\right),$$

$\theta$ is defined as $$\theta \triangleq e^{\sqrt{\frac{2}{\sigma^2}}}.$$

10. The method according to claim 1, wherein a probability assignment to each bit-plane symbol is determined based on previously encoded bit-plane symbols.

11. The method according to claim 10, wherein the probability assignment to the bit-plane symbol is determined by $$P_j = \frac{N_a}{N} P_j^{N_a} + \left(1 - \frac{N_a}{N}\right) p_j^{ML}$$

wherein $P_j$ is the probability assignment to the current bit-plane symbol, j is the bit-plane, $N_a$ is the number of bit-plane symbols coded until the end of the previous bit-plane, N is the number of bit-plane symbols coded until the current bit-plane symbol, $P_j^{N_a}$ is the estimation of $P_j$ after observing $N_a$ bit-plane symbols, $P_j^{ML}$ is the maximum likelihood estimation of $P_j$ for the current bit-plane and is defined by $$P_j^{ML} = \frac{\sum_{j=1}^{N-N_a} b_{i,j}}{N - N_a}$$

wherein $b_{i,j}$ is the bit-plane symbol.

12. The method according to claim 11, wherein the estimation of $P_j$ after observing $N_a$ bit-plane symbols, $P_j^{N_a}$, is updated by $$P_j^{N_a} = \frac{\sqrt{P_{j+1}^{N_a}}}{\sqrt{1 - P_{j+1}^{N_a}} + \sqrt{P_{j+1}^{N_a}}}$$

wherein $P_{j+1}^{N_a}$ is the estimation of $P_j$ from the previous bit-plane.

13. A method for decoding an encoded binary string of bit-plane symbols, the encoded binary string of bit-plane symbols being obtained from bit symbols generated by a data source, in particular a video, still image or audio source, the method comprising:

decoding the encoded binary string of bit-plane symbols using a further statistical model to generate a further binary string of bit-plane symbols, re-constructing a plurality of bit-planes comprising the bit-plane symbols using the further binary string of bit-plane symbols, producing a decoded data representing the bit symbols generated by the data source, wherein the decoded data is output as the video, the still image or the audio, wherein the further statistical model is based on statistical properties of a Laplacian probability distribution function which characterizes the decoded data, wherein the Laplacian probability distribution function is defined by $$f(x) = \frac{e^{-|x|\sqrt{\frac{2}{\sigma^2}}}}{\sqrt{2\sigma^2}}$$

wherein $\sigma$ is the standard deviation of the Laplacian probability distribution function.

14. The method according to claim 13, wherein the decoding of the binary string of bit-plane symbols is performed by an entropy decoder.

15. The method according to claim 14, wherein an arithmetic decoder is used as the entropy decoder.

16. The method according to claim 13, wherein a probability assignment to each bit-plane symbol is determined based on the Laplacian probability distribution function and is used to determine the further statistical model for decoding the binary string of bit-plane symbols.

17. The method according to claim 16, wherein the probability assignment to the bit-plane symbol is determined by $$P_j = 1 - \left(1 + e^{-2^j \sqrt{\frac{2}{\sigma^2}}}\right)^{-1}, \quad j = M-1, M-2, \ldots$$

wherein $P_j$ is the probability assignment to the bit-plane symbol, and j is the bit-plane.

18. The method according to claim 16, wherein the probability assignment to the bit-plane is determined by $$Q_j^L = \begin{cases} \frac{1}{1 + 2^{2^{j-L}}}, & j \geq L \\ \frac{1}{2}, & j < L \end{cases}$$

wherein $Q_j^L$ is the probability assignment of the $j^{th}$ bit-plane,

L is the integer representing a predetermined optimal bit-plane from the plurality of constructed bit-planes, and j is the bit-plane.

19. The method according to claim 16, wherein the probability assignment to the bit-plane is determined by $$Q_j^L = \begin{cases} \frac{1}{1 + 2^{2^{j-L}}}, & j \geq L \\ \frac{1}{2}, & j < L \end{cases}$$

wherein $Q_j^L$ is the probability assignment of the $j^{th}$ bit-plane,

L is the integer representing a predetermined optimal bit-plane from the plurality of constructed bit-planes, and j is the bit-plane.

20. The method according to claim 18 or 19, wherein the data source is re-constructed from the bit-planes by $$\hat{x}_i = (2s_i - 1)\left(\sum_{j=M-1}^{T} b_{i,j} 2^j + \sum_{j=T-1}^{-\infty} Q_j^L 2^j\right)$$

wherein $\hat{x}_i$ is the re-constructed data source, $s_i$ is a sign symbol of $\hat{x}_i$, $b_{i,j}$ is the bit-plane symbol, and T is the bit-plane the decoded binary string of bit-plane symbols is terminated.

21. The method according to claim 13, wherein a probability assignment to each bit-plane symbol is determined based on previously decoded bit-plane symbols.

22. The method according to claim 21, wherein the probability assignment to the bit-plane symbol is determined by $$P_j = \frac{N_a}{N} P_j^{N_a} + \left(1 - \frac{N_a}{N}\right) P_j^{ML}$$

wherein $P_j$ is the probability assignment to the current bit-plane symbol, j is the bit-plane, $N_a$ is the number of bit-plane symbols coded until the end of the previous bit-plane, N is the number of bit-plane symbols decoded until the current bit-plane symbol, $P_j^{N_a}$ is the estimation of $P_j$ after observing $N_a$ bit-plane symbols, $P_j^{ML}$ is the maximum likelihood estimation of $P_j$ for the current bit-plane and is defined by $$P_j^{ML} = \frac{\sum_{j=1}^{N-N_a} b_{i,j}}{N - N_a}$$

wherein $b_{i,j}$ is the bit-plane symbol.

23. The method according to claim 17 or 22, wherein the data source is re-constructed from the bit-planes by $$\hat{x}_i = (2s_i - 1)\left(\sum_{j=M-1}^{T} b_{i,j} 2^j + \sum_{j=T-1}^{-\infty} P_j 2^j\right),$$

wherein $\hat{x}_i$ is the re-constructed data source, $s_i$ is a sign symbol of $\hat{x}_i$, $b_{i,j}$ is the bit-plane symbol, and T is the bit-plane the decoded binary string of bit-plane symbols is terminated.

24. The method according to claim 22, wherein the estimation of $P_j$ after observing $N_a$ bit-plane symbols, $P_j^{N_a}$, is updated by $$P_j^{N_a} = \frac{\sqrt{P_{j+1}^{N_a}}}{\sqrt{1 - P_{j+1}^{N_a}} + \sqrt{P_{j+1}^{N_a}}}$$

wherein $P_{j+1}^{N_a}$ is the estimation of $P_j$ from the previous bit-plane.

25. A device for processing bit symbols generated by a data source, in particular a video, still image or audio source, comprising:

a bit-plane construction unit for constructing a plurality of bit-planes from the data source, each bit-plane comprising a plurality of bit-plane symbols, and scanning the bit-plane symbols of each bit-plane to generate a binary string of bit-plane symbols, a statistical model unit for providing statistical information based on statistical properties of a Laplacian probability distribution function which characterizes the data source, wherein the Laplacian probability distribution function is defined by $$f(x) = \frac{e^{-|x|\sqrt{\frac{2}{\sigma^2}}}}{\sqrt{2\sigma^2}}$$

wherein σ is the standard deviation of the Laplacian probability distribution function and an encoding unit for encoding the binary string of bit-plane symbols based on the statistical information provided by the statistical model unit.

26. A computer readable medium, having a program recorded thereon, wherein the program is to make the computer execute a procedure for processing bit symbols generated by a data source, in particular a video, still image or audio source, the procedure comprising:
constructing a plurality of bit-planes using the bit symbols generated by the data source, each bit-plane comprising a plurality of bit-plane symbols;
scanning the bit-plane symbols of each bit-plane to generate a binary string of bit-plane symbols;
encoding the binary string of the bit-plane symbols using a statistical model, wherein the statistical model is based on statistical properties of a Laplacian probability distribution function which characterizes the data source, wherein the Laplacian probability distribution function is defined by $$f(x) = \frac{e^{-|x|\sqrt{\frac{2}{\sigma^2}}}}{\sqrt{2\sigma^2}}$$

wherein σ is the standard deviation of the Laplacian probability distribution function.

27. A device for decoding an encoded binary string of bit-plane symbols, the encoded binary string of bit-plane symbols being obtained from bit symbols generated by a data source, in particular a video, still image or audio source, the device comprising:
a decoding unit for decoding the encoded binary string of bit-plane symbols using a further statistical model to generate a further binary string of bit-plane symbols,
a re-constructing unit for re-constructing a plurality of bit-planes comprising the bit-plane symbols using the further binary string of bit-plane symbols, and for producing a decoded data representing the bit symbols generated by the data source, wherein the decoded data is output as the video, the still image or the audio,
a further statistical model unit for providing the further statistical model, wherein the further statistical model is based on statistical properties of a Laplacian probability distribution function which characterizes the decoded data, wherein the Laplacian probability distribution function is defined by $$f(x) = \frac{e^{-|x|\sqrt{\frac{2}{\sigma^2}}}}{\sqrt{2\sigma^2}}$$

wherein σ is the standard deviation of the Laplacian probability distribution function.

28. A computer readable medium, having a program recorded thereon, wherein the program is to make the computer execute a procedure for decoding an encoded binary string of bit-plane symbols, the encoded binary string of bit-plane symbols being obtained from bit symbols generated by a data source, in particular a video, still image or audio source, the device, the procedure comprising:
decoding the encoded binary string of bit-plane symbols using a further statistical model to generate a further binary string of bit-plane symbols,
re-constructing a plurality of bit-planes comprising the bit-plane symbols using the further binary string of bit-plane symbols, producing a decoded data representing the bit symbols generated by the data source, wherein the decoded data is output as the video, the still image or the audio,
wherein the further statistical model is based on statistical properties of a Laplacian probability distribution function which characterizes the decoded data, wherein the Laplacian probability distribution function is defined by $$f(x) = \frac{e^{-|x|\sqrt{\frac{2}{\sigma^2}}}}{\sqrt{2\sigma^2}}$$

wherein σ is the standard deviation of the Laplacian probability distribution function.

* * * * *